United States Patent
Kundaliya et al.

(10) Patent No.: US 8,937,332 B2
(45) Date of Patent: Jan. 20, 2015

(54) WAVELENGTH CONVERTER FOR AN LED AND LED CONTAINING SAME

(75) Inventors: Darshan Kundaliya, Beverly, MA (US); Madis Raukas, Lexington, MA (US); Adam M. Scotch, Amesbury, MA (US); David Hamby, Andover, MA (US); Kailash Mishra, North Chelmsford, MA (US); Matthew Stough, Exeter, NH (US)

(73) Assignee: OSRAM SYLVANIA Inc., Danvers, MA (US)

( * ) Notice: Subject to any disclaimer, the term of this patent is extended or adjusted under 35 U.S.C. 154(b) by 0 days.

(21) Appl. No.: 13/982,667

(22) PCT Filed: Jan. 31, 2012

(86) PCT No.: PCT/US2012/023222
§ 371 (c)(1),
(2), (4) Date: Jul. 30, 2013

(87) PCT Pub. No.: WO2012/106282
PCT Pub. Date: Aug. 9, 2012

(65) Prior Publication Data
US 2013/0313603 A1    Nov. 28, 2013

Related U.S. Application Data

(60) Provisional application No. 61/439,462, filed on Feb. 4, 2011.

(51) Int. Cl.
*H01L 33/00* (2010.01)
*H01L 33/50* (2010.01)
(Continued)

(52) U.S. Cl.
CPC .......... *H01L 33/502* (2013.01); *C09K 11/7701* (2013.01); *C09K 11/7721* (2013.01); *C09K 11/7774* (2013.01); *C30B 23/025* (2013.01); *C30B 23/066* (2013.01); *C30B 29/68* (2013.01)
USPC ................................ 257/98; 257/99; 117/108

(58) Field of Classification Search
USPC ........................................ 257/98.99; 117/108
See application file for complete search history.

(56) References Cited

U.S. PATENT DOCUMENTS 4,414,290 A * 11/1983 Breed et al. ................... 428/700
4,728,178 A * 3/1988 Gualtieri et al. .............. 359/282
(Continued)

FOREIGN PATENT DOCUMENTS

EP    2 631 534 A2    8/2013

OTHER PUBLICATIONS

Kottaisamy et al., Color Tuning of Y3A15O12:Ce phosphor and their blend for white LEDS, Materials Research Bulletin 43 (2008) 1657-1663.

(Continued)

*Primary Examiner* — Phuc Dang
(74) *Attorney, Agent, or Firm* — Robert F. Clark

(57) ABSTRACT

A wavelength converter for an LED is described that comprises a substrate of monocrystalline garnet having a cubic crystal structure, a first lattice parameter and an oriented crystal face. An epitaxial layer is formed directly on the oriented crystal face of the substrate. The layer is comprised of a monocrystalline garnet phosphor having a cubic crystal structure and a second lattice parameter that is different from the first lattice parameter wherein the difference between the first lattice parameter and the second lattice parameter results in a lattice mismatch within a range of ±15%. The strain induced in the phosphor layer by the lattice mismatch shifts the emission of the phosphor to longer wavelengths when a tensile strain is induced and to shorter wavelengths when a compressive strain is induced. Preferably, the wavelength converter is mounted on the light emitting surface of a blue LED to produce an LED light source.

18 Claims, 5 Drawing Sheets

(51) Int. Cl.
  *C09K 11/77* (2006.01)
  *C30B 23/02* (2006.01)
  *C30B 23/06* (2006.01)
  *C30B 29/68* (2006.01)

(56) References Cited

U.S. PATENT DOCUMENTS

| | | | |
|---|---|---|---|
| 4,757,232 A * | 7/1988 | Berkstresser et al. | 313/468 |
| 6,045,626 A * | 4/2000 | Yano et al. | 148/33.4 |
| 7,038,370 B2 | 5/2006 | Mueller-Mach et al. | |
| 2008/0231170 A1* | 9/2008 | Masato et al. | 313/501 |
| 2010/0269887 A1* | 10/2010 | Reyal et al. | 136/249 |
| 2010/0289044 A1* | 11/2010 | Krames et al. | 257/98 |

OTHER PUBLICATIONS

May-Smith et al., Comparative growth study of garnet crystal films fabricated by pulsed laser deposition, J. Crystal Growth 308 (2007) 382-391.

Choe, Luminescence and compositional analysis of Y3Al5O12:Ce films fabricated by pulsed-laser deposition, Mat. Res. Innovat. (2002) 6:236-241.

Deng et al., Thin film rf magnetron sputtering of gadolinium-doped yttrium aluminum garnet ultraviolet emitting materials, Optical Materials 29 (2006) 183-191.

Gundiah et al., Novel red phosphors based on vanadate garnets for solid state lighting applications, Chem Phys. Lett. 455 (2008) 279-283.

Setlur et al., Incorporation of Si4+-N3− into Ce3+—Doped Garnets for Warm White LED Phosphors, Chem. Mater. (2008) A-G.

Chen et al., Effects of fluxes on the synthesis of Ca3Sc2Si3O12:Ce3+ green phosphors for white light-emitting diodes, Materials Science and Engineering B 166 (2010) 24-27.

Kucera et al., Defects in Ce-doped LuAG and YAG scintillation layers grown by liquid phase epitaxy, Radiation Measurments 45 (2010) 449-452.

Gill et al., Growth of crystalline Gd3Ga5O12 thin-film optical waveguides by pulsed laser deposition, Materials Letters 25 (1995) 1-4.

Zorenko, Luminescence of isoelectronic impurities and antisite defects in garnets, Phys. Stat. Sol. (c) 2 No. 1 (2005) 275-379.

Kucera et al., Ce-doped YAG and LuAG Epitaxial Films for Scintillation Detectors, IEEE Transactions on Nuclear Science vol. 55 No. 3 (2008) 1201-1205.

Kucera et al., Growth and characterization of YAG and LuAG epitaxial films for scintillation applications, J. Crystal Growth 312 (2010) 1538-1545.

Zorenko et al., Single-crystalline films of Ce-doped YAG and LuAG phosphors: advantages over bulk crystals analogues, J. Luminescence 114 (2005) 85-94.

PCT Search Report for PCT/US2012/023222.

* cited by examiner

WAVELENGTH CONVERTER FOR AN LED AND LED CONTAINING SAME

CROSS REFERENCES TO RELATED APPLICATIONS

This application claims the benefit of U.S. Provisional Application No. 61/439,462, filed Feb. 4, 2011.

TECHNICAL FIELD

This invention relates to wavelength converters for light emitting diodes (LEDs). More particularly, this invention relates to thin film converter elements for white light generation.

BACKGROUND OF THE INVENTION

The development in the 1990s of a high-brightness blue-light-emitting LED made possible the introduction of commercial high-efficiency, white-light-emitting LEDs that are usable in general lighting applications. The realization of white light from these monochromatic blue LEDs is achieved by employing phosphors which convert at least a portion of the shorter-wavelength blue light into longer green, yellow and red wavelengths. One phosphor system of considerable interest for such phosphor-conversion LEDs (pc-LEDs) is based on the family of cerium-activated garnets represented by the general formula $A_3B_5O_{12}$:Ce, wherein A is Y, Sc, La, Gd, Lu, or Tb and B is Sc, Al or Ga. These garnet-based phosphors have a cubic lattice structure and absorb wavelengths in the range from 420 nm to 490 nm which means that they are excitable by radiation from a blue light source such as a blue LED. Other garnet phosphors such as (Y, La, Gd)$Na_2Mg_2V_3O_{12}$:Eu, Bi and $Ca_3Sc_2Si_3O_{12}$:Mg,Ce are also of interest for pc-LEDs because of their red-light emissions which may be used to improve the color rendering index (CRI) of white-emitting pc-LEDs.

Of the garnet phosphors, cerium-activated yttrium aluminum garnet, $Y_3Al_5O_{12}$:Ce, (YAG:Ce), has seen widespread use in commercial white-emitting pc-LEDs. The YAG:Ce phosphor has been shown to be a very efficient converter for blue wavelengths generating a broad intense yellow emission band centered at about 575 nm. This intense yellow emission and the remaining unconverted blue light emitted by the LED combine to form a white light emission.

One drawback to using the YAG:Ce phosphor by itself in a pc-LED is that the white emission from the pc-LED has a high color temperature and relatively low color rendering index (CRI). One way to produce a warmer white light and increase CRI is to add a red-emitting phosphor. However, phosphor mixtures tend to have reduced efficacy because the phosphors interfere with one another due to energy transfer via overlapping emission and absorption as well as non-radiative processes. Another way to adjust the emission of the pc-LED is to change the elemental composition of the phosphor to increase output in the desired wavelength range. Unfortunately, this can also affect the efficiency of the phosphor, resulting in a lower efficacy LED.

Phosphor-conversion LEDs can also be used to produce single-color LEDs by fully converting blue or UV light emitted by an LED into another color such as green or red. This is desirable in some cases because the pc-LED efficacy is greater than that of the comparable monochromatic direct semiconductor LED. However, the range of colors that can be produced by full conversion is similarly limited by the ability to manipulate the composition of available phosphors.

Thus it would be an advantage for both white and single-color pc-LEDs to be able to adjust the emission colors of available garnet-based phosphors without having to change their composition.

SUMMARY OF THE INVENTION

It has been discovered that the emission wavelengths of garnet phosphors, in particular YAG:Ce and LuAG:Ce (cerium-activated lutetium aluminum garnet, $Lu_3Al_5O_{12}$:Ce), can be shifted in predictable ways by growing a monocrystalline phosphor film on a monocrystalline substrate that has a slightly different lattice parameter than the phosphor film. The strain induced in the phosphor film by the lattice mismatch shifts the emission of the phosphor to longer wavelengths (red shift) when a tensile strain is induced and to shorter wavelengths (blue shift) when a compressive strain is induced in the film growth direction. This effect is believed to be a result of the modification in the ligand fields around the activator ion (in this case $Ce^{3+}$) that changes electronic interaction between the activator and the ligands. Thus it is possible to effect a change in the emission properties of garnet-based phosphors without changing the phosphor's composition.

More particularly, the garnet-based phosphor films are epitaxially grown on an oriented crystal face of another monocrystalline cubic garnet, e.g., undoped YAG ($Y_3Al_5O_{12}$) or GGG ($Gd_3Ga_5O_{15}$). Preferably, pulsed laser deposition (PLD) is used as a method to preserve the stoichiometry of the phosphor films upon growth. The composition of growth substrate or buffer layer is selected to increase/decrease the lattice mismatch and hence influence the emission parameters (peak wavelength, band width, etc.) in a desired way. The phosphor composition remains unchanged.

In accordance with one aspect of the invention, there is provided a wavelength converter for an LED, comprising a substrate of monocrystalline garnet having a cubic crystal structure, a first lattice parameter and an oriented crystal face; and an epitaxial layer formed directly on the oriented crystal face of the substrate, the layer comprising a monocrystalline garnet phosphor having a cubic crystal structure and a second lattice parameter that is different from the first lattice parameter, the difference between the first lattice parameter and the second lattice parameter resulting in a lattice mismatch within a range of ±15%.

In accordance with another aspect of the invention, there is provided a method of making a wavelength converter for an LED, comprising forming an epitaxial layer of a monocrystalline garnet phosphor on an oriented crystal face of a monocrystalline garnet substrate, the monocrystalline garnet substrate having a cubic structure and a first lattice parameter, and the monocrystalline garnet phosphor having a cubic structure and a second lattice parameter that is different from the first lattice parameter, the difference between the first lattice parameter and the second lattice parameter resulting in a lattice mismatch within a range of ±15%.

In accordance with yet another aspect of the invention, there is provided an LED light source comprising: an LED and a wavelength converter mounted on a light emitting surface of the LED, the wavelength converter converting at least a portion of the light emitted by the LED into light having a longer wavelength, the wavelength converter comprising: a substrate of monocrystalline garnet having a cubic crystal structure, a first lattice parameter and an oriented crystal face; and an epitaxial layer formed directly on the oriented crystal face of the substrate, the layer comprising a monocrystalline garnet phosphor having a cubic crystal structure and a second lattice parameter that is different from the first lattice parameter, the difference between the first lattice parameter and the second lattice parameter resulting in a lattice mismatch within a range of ±15%.

DETAILED DESCRIPTION OF THE INVENTION

Figure 1:
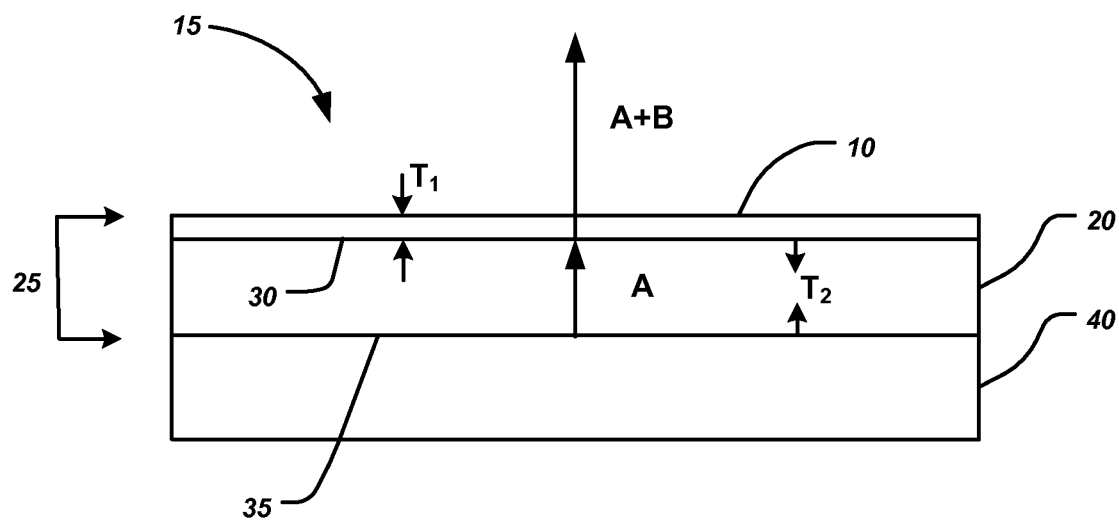
FIG. 1 is a cross-sectional illustration of a pc-LED according to an embodiment of this invention.

For a better understanding of the present invention, together with other and further objects, advantages and capabilities thereof, reference is made to the following disclosure and appended claims taken in conjunction with the above-described drawings.

Epitaxy refers to the method of depositing a monocrystalline (single crystal) film on an oriented monocrystalline substrate. The deposited film is referred to as an epitaxial film or epitaxial layer and has a definite crystal orientation with respect to the lattice of the substrate on which it is grown. Epitaxial growth requires that the atomic spacing, the lattice parameter (or lattice constant), of the film material and the substrate material not differ by more than a few percent.

Since the materials described herein have a cubic crystal structure, the structure is definable by a single lattice parameter (or lattice constant) "a." Consequently the lattice mismatch may be defined in terms of how much the ratio of the lattice parameter of the film to the lattice parameter of the substrate, $a_{film}/a_{substrate}$, differs from unity, $a_{film}/a_{substrate}-1$. The value of this mismatch may also be expressed as a percentage, $(a_{film}/a_{substrate}-1) \times 100\%$. Moreover, in terms of the strain induced in the film, if $a_{film} > a_{substrate}$, the film is tensioned in the direction of film growth and, if $a_{film} < a_{substrate}$, the film is compressed in the direction of film growth.

To increase the likelihood of obtaining a well-luminescing epitaxial film, the substrate on which the film is grown should have a similar crystal structure. If the lattice mismatch is too large the film will not grow epitaxially and must be annealed in order to become crystalline and luminescent.

The preferred garnet-based phosphors used in this invention may represented by the general formula $A_3B_5O_{12}$:Ce, wherein A is Y, Sc, La, Gd, Lu, or Tb and B is Al, Ga or Sc. These garnet-based phosphors have a cubic lattice structure and preferably absorb wavelengths in the range from 420 nm to 490 nm. Preferably, the concentration of cerium is from about 0.001 to about 0.1 moles cerium per mole of phosphor. More preferably, the concentration of cerium is from about 0.005 to about 0.05 moles cerium per mole of phosphor. In the case of YAG:Ce or LuAG:Ce, the concentration of cerium is preferably from about 0.1 atomic percent Ce (at. % Ce) to about 10 at. % Ce, wherein atomic percent Ce (at. % Ce) is defined as the number of cerium atoms divided by the total number of cerium and yttrium (and/or lutetium) atoms expressed as a percentage, $\{Ce/(Ce+Y,Lu)\}*100\%$. More preferably, the concentration of cerium is from about 0.5 at. % Ce to about 5 at. % Ce.

Other garnet phosphors include garnet phosphors having compositions represented by the following formulas:

(i) $(A_1A_2')(B_2B_3')O_{12}$:Eu,Bi wherein A=Y, La, Gd; A'=Na, K, Li; B=Mg, Ca, Sr, Ba; and B'=V, Ti, Sc, Nb, Zr;

(ii) $A_3B_2B_3'O_{12}$:Mg,Ce wherein A=Ca, Sr, Ba; B=Sc, Ti, V, Nb; and B'=Si, Ge, Ga, Al, Sn, In; or (iii) $(AA')_3(BB')_5O_{12}$ wherein A=Y, La, Lu, Gd; A'=Mg, Ca, Sr, Ba; and B or B'=Al, Si, Ge.

A cross-sectional illustration of a pc-LED 15 according to an embodiment of this invention is shown in FIG. 1. The wavelength converter 25 is comprised of a monocrystalline thin film of a garnet-based phosphor 10 that is grown epitaxially on an oriented crystal face 30 of a substrate 20. The substrate 20 is comprised of another cubic monocrystalline garnet having a similar, but not identical, lattice parameter. The mismatch in the lattice parameters between the film 10 and the substrate 20 create strain in the film which shifts the emission peak of the phosphor film. Since the film growth is epitaxial, the film has a definite crystal orientation with respect to the crystal lattice of the substrate on which it is grown. The substrate 20 is mounted to the top light-emitting surface 35 of a blue-emitting LED 40. An InGaN LED is particularly suitable as the blue-emitting LED. The blue light emission from the LED has a wavelength in the range from 420 nm to 490 nm, and preferably 430 nm to 470 nm. UV- or near-UV-emitting LEDs are also suitable pump sources for such pc-LEDs.

The blue light from the LED 40 having a wavelength A passes through substrate 20, which is substantially transmissive with respect to the blue light. The blue light is then at least partially absorbed by the garnet-based phosphor film 10 and converted by the phosphor film 10 into light having a longer wavelength B. The unabsorbed blue light A and the light emitted by the phosphor B then produce a combined emission A+B from the pc-LED which is perceived as white light. (In the cases where full conversion is desired, only the light emitted by the phosphor forms the emission from the pc-LED.)

The thickness $T_1$ of the film 10 is preferably from 200 nm to 20000 nm and the thickness $T_2$ of the substrate is preferably 50 micrometers to 500 micrometers. The lattice mismatch between the film and substrate should be within the range of ±15%, preferably within the range of ±10%, and more preferably within the range of ±5%. If the lattice mismatch, as defined previously, is negative, i.e., the lattice parameter of the substrate is greater than the lattice parameter of the film, then a compressive strain is created in the phosphor film which shifts the emission to shorter wavelengths. If the lattice mismatch is positive, i.e., the lattice parameter of the film is greater than the lattice parameter of the substrate, a tensile strain is created in the phosphor film which shifts the emission to longer wavelengths. Theoretically, this can be explained as a change in the crystal field splitting parameter 10Dq which is the energy difference between the low-energy three-fold degenerate electronic state, $t_{2g}$, and the high-energy two-fold degenerate state, $e_g$, of the trivalent cerium ($Ce^{3+}$) The compressive strain with its resultant shift towards shorter wavelengths (blue-shift) in garnets may be viewed due to a reduction of 10Dq. Conversely, the phosphor emission can be shifted to longer wavelengths (red-shifted) if the strain compels 10Dq to increase. By modifying the level of strain in the film, one can adjust the spectral emission to the desired output. The amount of strain in the film can also be further controlled by adjusting the thickness of phosphor film due to a gradual relaxation of the strain as the film thickness increases.

EXAMPLES

Epitaxial YAG:Ce Films

Strain-Induced Engineering for White pc-LEDs

Thin films of YAG:Ce were grown on YAG (100), YAG (111) and GGG (111) substrates under identical growth parameters using pulsed laser deposition (PLD). The PLD growth parameters are given in Table 1. The films grew epitaxially and the as-deposited films exhibited the expected photoluminescence (PL). This is in contrast to similar films grown on c-$Al_2O_3$ and fused silica (quartz) substrates where a post-annealing treatment was necessary to observe photoluminescence. As shown in Table 1, the emission bands for the YAG:Ce films grown on YAG (111) and GGG (111) were red and blue shifted, respectively, from that of the films grown on YAG (100). This trend was observed irrespective of the density of the target.

TABLE 1

| Substrate | Laser energy | Growth temperature (° C.) | Thickness (nm) | Emission wavelength (nm) |
|---|---|---|---|---|
| YAG-100 | 200 mJ | 1050 | 950 | 592 |
| GGG-111 | 200 mJ | 1050 | 880 | 569 |
| YAG-111 | 200 mJ | 1050 | 804 | 596 |

Figure 2:
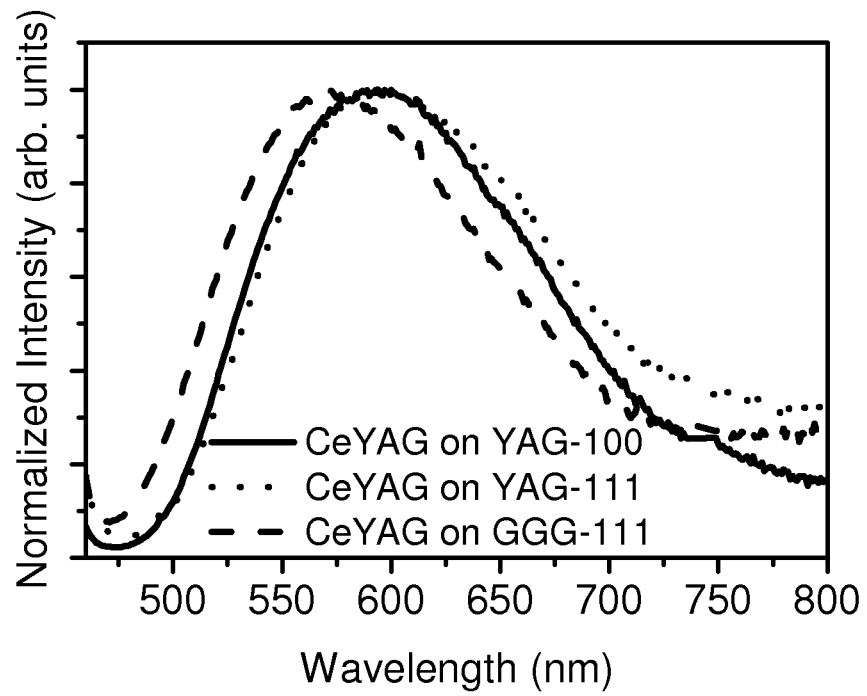
FIG. 2 compares the photoluminescence under 450 nm excitation of YAG:Ce films grown on YAG(100), YAG (111) and GGG (111) substrates.

FIG. 2. shows the PL under 450 nm excitation of YAG:Ce (4at. % Ce) films grown on YAG (100), YAG (111) and GGG (111) substrates. The primary reason for the shifting emission appears to be the lattice mismatch between the films and substrates. The lattice parameter, a, is 12.01 Å for YAG and 12.382 Å for GGG with a cubic structure. When YAG:Ce is grown on GGG it experiences compressive strain with a lattice mismatch of about −3.1% resulting in a blue-shifted emission at 569 nm. On the other hand, when using YAG (111) or YAG (100) substrates, the lattice mismatch to Ce:YAG is <1% (larger $Ce^{3+}$ (ionic radius 115 pm) replaces $Y^{3+}$ (ionic radius 104 pm)). This induces tensile strain and hence red shift. These results demonstrate that one can selectively achieve the desired spectral output by selecting the appropriate substrate. When placed on blue LEDs, the cumulative output of the PL from the film and the pump LED will define each time a different color point.

Figure 3:
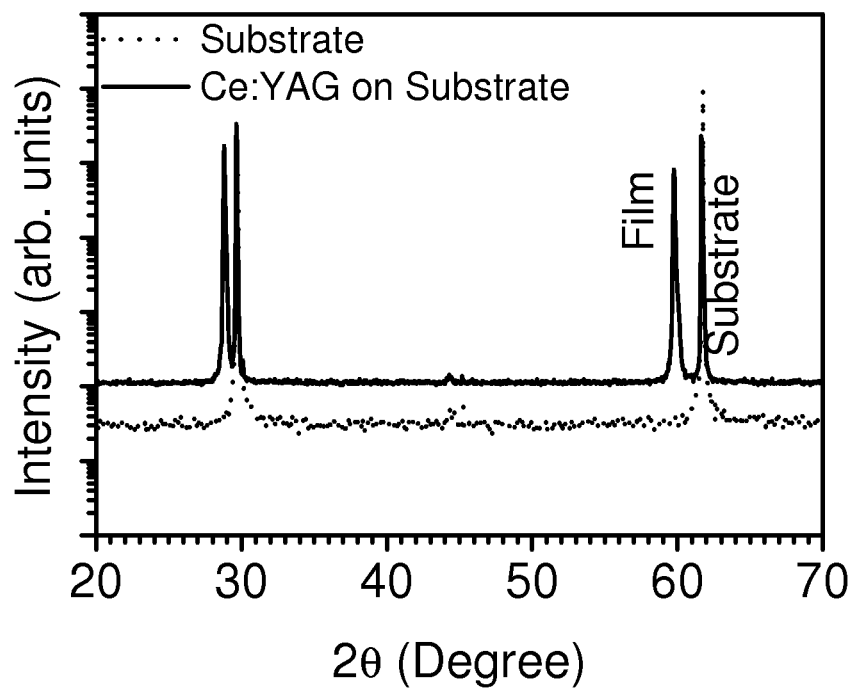
FIG. 3 is a θ-2θ x-ray diffraction (XRD) scan of a YAG:Ce film on YAG (100).
Figure 4:
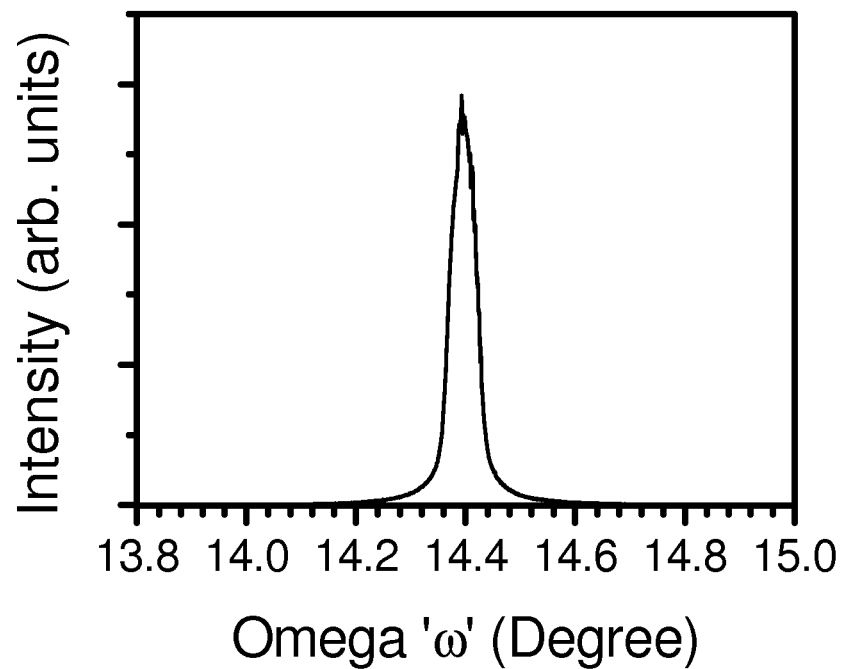
FIG. 4 is an omega scan of the YAG:Ce film on YAG (100).

X-ray diffraction studies were carried out on several thin films grown on the garnet substrates YAG (100), YAG (111) and GGG (111). As expected, films were epitaxially oriented as 100 and 111 planes when grown on 100 and 111 oriented garnet substrates, respectively. It has been also noted that crystalline quality of the film is better when grown on YAG (100) substrate. FIG. 3 shows θ-2θ XRD scan of YAG:Ce on YAG (100). The dotted line is the diffraction peak of YAG (100) substrate whereas the solid line represents the same from the YAG:Ce film on this substrate. It can be seen that only peaks for the expected epitaxial (400) and (800) orientations have been detected. FIG. 4 is an omega scan for determination of the degree of crystallinity by measuring full width at half maximum (FWHM) of the film peak. It turns out that the FWHM is approx. 0.0572° suggesting a high quality monocrystalline growth.

Figure 5:
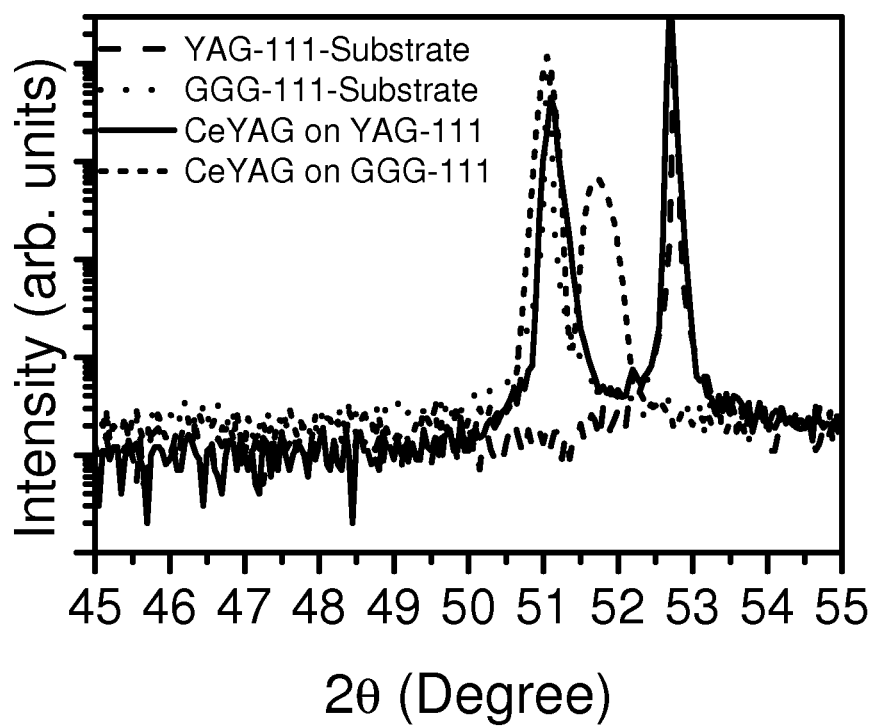
FIG. 5 shows θ-2θ XRD scans of YAG:Ce on YAG (111) and GGG (111) substrates.

FIG. 5 shows θ-2θ XRD scan of YAG:Ce thin films on YAG (111) and GGG (111) substrates. On YAG(111), the YAG:Ce film experiences a clear tensile strain that makes the 'd' spacing larger (corresponding to lower 2θ values) and on GGG(111) it experiences a compressive strain that makes the 'd' spacing smaller (corresponding to higher 2θ values).

Epitaxial LuAG:Ce Films

Strain-Induced Engineering for Single-Color Green pc-LEDs

Epitaxial thin films of $Lu_3Al_5O_{12}$:Ce (LuAG:Ce) were deposited on monocrystalline YAG (111), YAG (100) and GGG (111) substrates by PLD. The PLD growth parameters for the LuAG:Ce (0.5 at. % Ce) films are given in Table 2. The lattice parameter of LuAG is 11.91 Å and that of GGG is 12.382 Å, both with cubic structure. Hence, the lattice mismatch for depositing LuAG on GGG is about −3.8% compared to about −0.8% on YAG (111). The greater mismatch in lattice parameters manifests itself in a blue-shifted emission for LuAG:Ce on GGG (111) compared to thin films of LuAG:Ce grown on YAG substrates.

TABLE 2

| Sample | Laser energy (mJ) | Growth temperature (° C.) | Thickness (nm) | Emission wavelength (nm) | Gas environment | |
|---|---|---|---|---|---|---|
| | | | | | During growth | During cooling |
| (a) YAG-100 | 300 | 1050 | 593 | — | 3 mTorr $O_2$ | 300 Torr 3% $H_2$ + $N_2$ balance |
| (b) YAG-111 | 300 | 1050 | 501 | 513/562 | 3 mTorr $O_2$ | 300 Torr 3% $H_2$ + $N_2$ balance |
| (c) GGG-111 | 300 | 1050 | 603 | 507/562 | 3 mTorr $O_2$ | 300 Torr 3% $H_2$ + $N_2$ balance |
| (d) YAG-111 | 300 | 1050 | 391 | 511/553 | 3 mTorr $O_2$ | 3 mTorr $O_2$ |
| (e) GGG-111 | 300 | 1050 | 377 | 505/549 | 3 mTorr $O_2$ | 3 mTorr $O_2$ |

Figure 6:
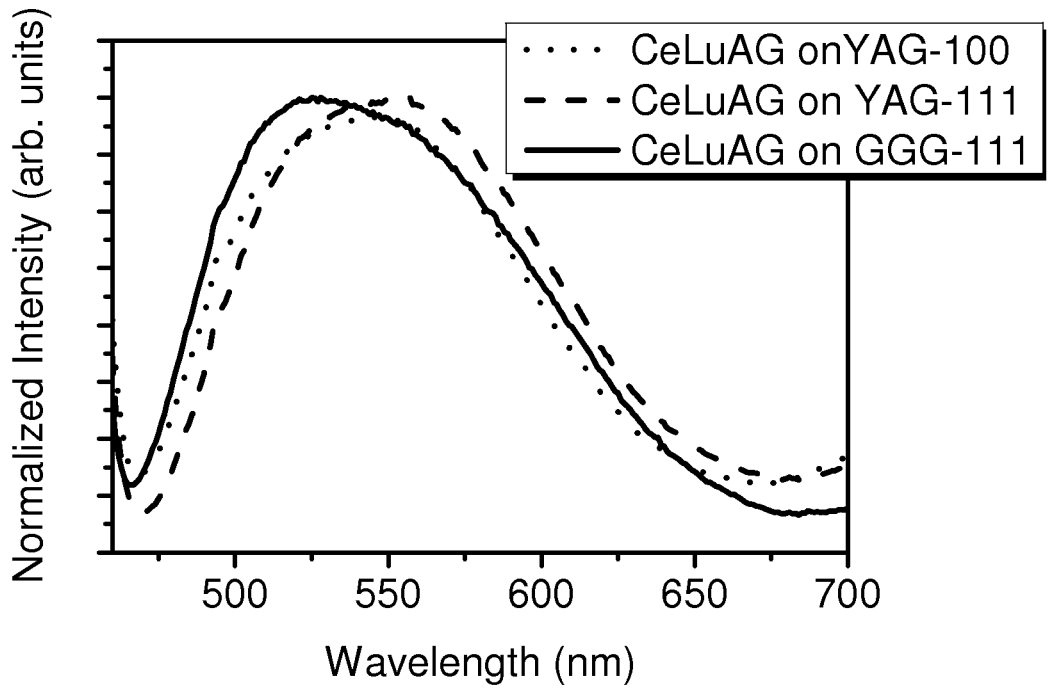
FIGS. 6 and 7 compare the photoluminescence under 450 nm excitation of LuAG:Ce films grown on YAG(100), YAG (111) and GGG (111) substrates.
Figure 7:
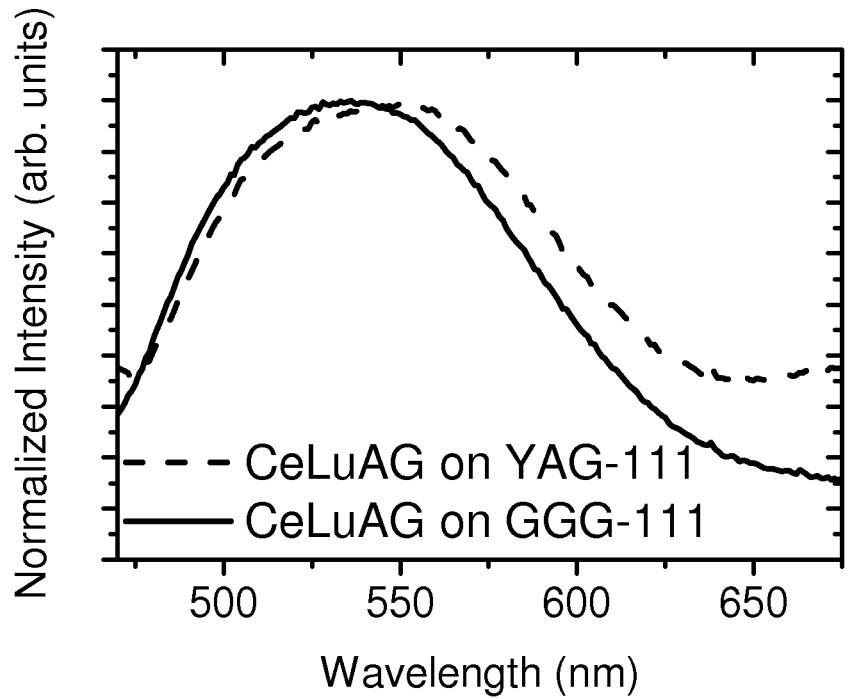

The PL spectra a ($\lambda_{excitation}$=450 nm) of the LuAG:Ce (0.5 at % Ce) films grown on YAG(100) YAG (111) and GGG (111) are shown in FIGS. 6 and 7. The broad emission band is observed to consist of two Gaussian components. In both cases, the first Gaussian component centered at 562 nm remains virtually independent of the substrate while the second Gaussian component shifts its position depending on the substrate used. The blue shift of the second Gaussian component in the case of the LuAG:Ce film grown on the GGG (111) substrate amounts to 6 nm (from 513 nm to 507 nm). This blue shift can be correlated with the creation of compressive strain on the $Ce^{3+}$ luminescence centers compared to the activator environment in a typical (bulk or unstrained) LuAG.

Figure 8:
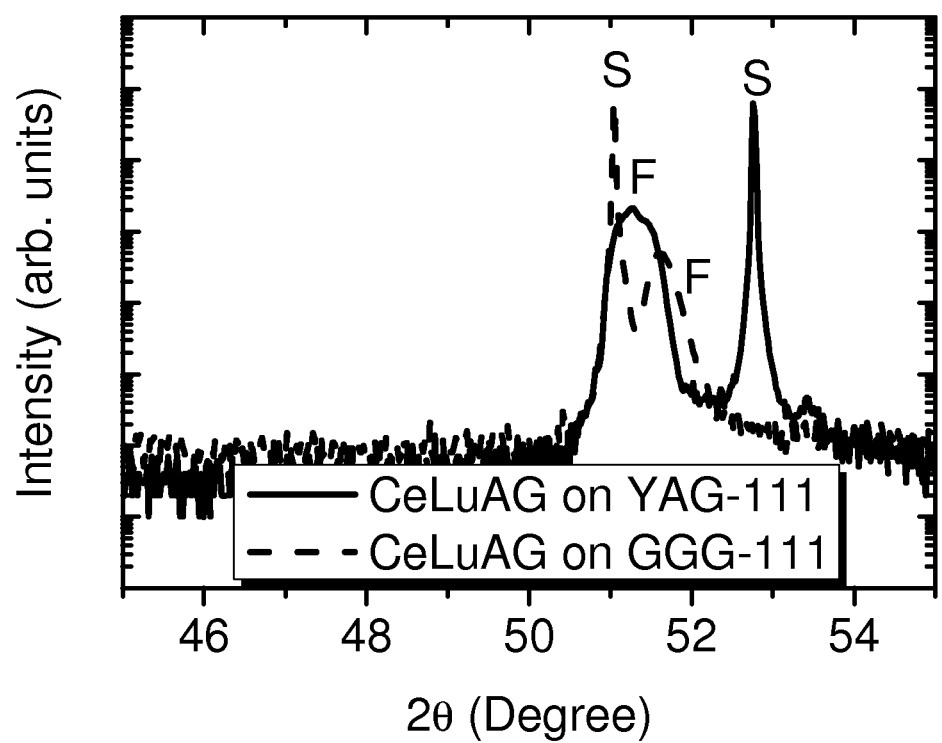
FIG. 8 shows θ-2θ XRD scans of LuAG:Ce films on YAG (111) and GGG (111) substrates.

FIG. 8 shows θ-2θ XRD scan of LuAG:Ce on YAG (111) and GGG (111) substrates. It can be seen that only peaks for the expected epitaxial orientations have been detected. The substrate peaks are denoted by 'S' and the film peaks are denoted by 'F'. It can be clearly seen from the film peak position that LuAG:Ce has different strain effects when grown on YAG or on GGG substrates.

While there have been shown and described what are at present considered to be preferred embodiments of the invention, it will be apparent to those skilled in the art that various changes and modifications can be made herein without departing from the scope of the invention as defined by the appended claims.

We claim:

1. A wavelength converter for an LED, comprising:
   a substrate of monocrystalline garnet having a cubic crystal structure, a first lattice parameter and an oriented crystal face; and
   an epitaxial layer formed directly on the oriented crystal face of the substrate, the layer comprising a monocrystalline garnet phosphor having a cubic crystal structure and a second lattice parameter that is different from the first lattice parameter, the difference between the first lattice parameter and the second lattice parameter resulting in a lattice mismatch within a range of about −3.1% to −15%.

2. The wavelength converter of claim 1 wherein the garnet phosphor is a cerium-activated garnet phosphor having a composition represented by a formula $A_3B_5O_{12}$:Ce, wherein A is Y, Sc, La, Gd, Lu, or Tb and B is Sc, Al or Ga.

3. The wavelength converter of claim 2 where the garnet phosphor is selected from $Y_3Al_5O_{12}$:Ce or $Lu_3Al_5O_{12}$:Ce.

4. The wavelength converter of claim 2 wherein the substrate is GGG (111).

5. The wavelength converter of claim 2 wherein the phosphor contains from about 0.001 to about 0.1 moles cerium per mole of phosphor.

6. The wavelength converter of claim 2 wherein the phosphor contains from about 0.005 to about 0.05 moles cerium per mole of phosphor.

7. The wavelength converter of claim 2 wherein the garnet phosphor is $Lu_3Al_5O_{12}$:Ce and the substrate is GGG (111).

8. The wavelength converter of claim 3 wherein the substrate is GGG (111).

9. The wavelength converter of claim 3 wherein the phosphor contains from about 0.1 at.% Ce to about 10 at.% Ce.

10. The wavelength converter of claim 3 wherein the phosphor contains from about 0.5 at.% Ce to about 5 at.% Ce.

11. The wavelength converter of claim 1 wherein the garnet phosphor has a composition represented by a formula selected from:

(i) $(A_1A_2')(B_2B_3')O_{12}$:Eu,Bi wherein A=Y, La, Gd; A'=Na, K, Li; B=Mg, Ca, Sr, Ba; and B'=V, Ti, Sc, Nb, Zr;

(ii) $A_3B_2B_3'O_{12}$:Mg,Ce wherein A=Ca, Sr, Ba; B=Sc, Ti, V, Nb; and B'=Si, Ge, Ga, Al, Sn, In; or (iii) $(AA')_3(BB')_5O_{12}$ wherein A=Y, La, Lu, Gd; A'=Mg, Ca, Sr, Ba; and B or B', Al, Si, Ge.

12. The wavelength converter of claim 1 wherein the garnet phosphor is represented by the formula $(A_1A_2')(B_2B_3')O_{12}$—:Eu,Bi wherein A is Y, La, Gd; A' is Na, K, Li; B is Mg, Ca, Sr, Ba; and B' is V, Ti, Sc, Nb, Zr or the garnet phosphor is represented by the formula $A_3B_2B_3'O_{12}$:Mg,Ce wherein A is Ca, Sr, Ba; B is Sc, Ti, V, Nb; and B' is Si, Ge, Ga, Al, Sn, In.

13. An LED light source comprising: an LED and a wavelength converter mounted on a light emitting surface of the LED, the wavelength converter converting at least a portion of the light emitted by the LED into light having a longer wavelength, the wavelength converter comprising:
   a substrate of monocrystalline garnet having a cubic crystal structure, a first lattice parameter and an oriented crystal face; and
   an epitaxial layer formed directly on the oriented crystal face of the substrate, the layer comprising a monocrystalline garnet phosphor having a cubic crystal structure and a second lattice parameter that is different from the first lattice parameter, the difference between the first lattice parameter and the second lattice parameter resulting in a lattice mismatch within a range of about −3.1% to −15%.

14. The LED light source of claim 13 wherein the garnet phosphor is a cerium-activated garnet phosphor having a composition represented by a formula $A_3B_5O_{12}$:Ce, wherein A is Y, Sc, La, Gd, Lu, or Tb and B is Sc, Al or Ga.

15. The LED light source of claim 13 wherein the garnet phosphor is selected from $Y_3Al_5O_{12}$:Ce or $Lu_3Al_5O_{12}$:Ce.

16. The LED light source of claim 13 wherein the garnet phosphor is $Lu_3Al_5O_{12}$:Ce and the substrate is GGG (111).

17. The LED light source of claim 13 wherein the garnet phosphor is represented by the formula $(A_1A_2')(B_2B_3')O_{12}$:Eu,Bi wherein A is Y, La, Gd; A' is Na, K, Li; B is Mg, Ca, Sr, Ba; and B' is V, Ti, Sc, Nb, Zr or the garnet phosphor is represented by the formula $A_3B_2B_3'O_{12}$:Mg,Ce wherein A is Ca, Sr, Ba; B is Sc, Ti, V, Nb; and B' is Si, Ge, Ga, Al, Sn, In.

18. The LED light source of claim 13 wherein the LED emits light having a wavelength in a range from 420 nm to 490 nm.

* * * * *